United States Patent [19]

Sillner

[11] Patent Number: 5,494,149
[45] Date of Patent: Feb. 27, 1996

[54] CONVEYING DEVICE FOR ELECTRICAL COMPONENTS

[75] Inventor: Georg Sillner, Zeitlarn, Germany

[73] Assignee: Kamilla Sillner, Germany

[21] Appl. No.: 256,528

[22] PCT Filed: Jan. 13, 1993

[86] PCT No.: PCT/DE93/00021

§ 371 Date: Jul. 15, 1994

§ 102(e) Date: Jul. 15, 1994

[87] PCT Pub. No.: WO93/14009

PCT Pub. Date: Jul. 22, 1993

[30] Foreign Application Priority Data

Jan. 17, 1992 [DE] Germany .................. 42 01 117.5

[51] Int. Cl.[6] .................................................. B65G 17/46
[52] U.S. Cl. ............................... 198/471.1; 198/803.5
[58] Field of Search ........................... 198/803.5, 803.01, 198/465.4, 465.1, 465.3, 345.3, 339.1, 471.1

[56] References Cited

U.S. PATENT DOCUMENTS

| | | |
|---|---|---|
| 3,513,963 | 5/1970 | White . |
| 3,841,687 | 10/1974 | Banyas et al. ............... 198/803.5 X |
| 4,135,619 | 1/1979 | Cerboni .................... 198/803.5 X |
| 5,022,511 | 6/1991 | Gorrieri et al. ............. 198/471.1 X |

FOREIGN PATENT DOCUMENTS

| | | |
|---|---|---|
| 339202 | 10/1977 | Austria . |
| 02286506 | 2/1991 | Japan . |
| 517633 | 2/1972 | Switzerland . |

*Primary Examiner*—D. Glenn Yoan
*Attorney, Agent, or Firm*—Lucas & Just

[57] ABSTRACT

The invention concerns a novel design for a conveyor (12) for, preferably, electrical components (5). The conveyor includes a conveyor (13) in the form of a closed loop passing over at least two pulleys (14,15), plus holders (28), disposed on the conveyor, to hold the components (5).

17 Claims, 7 Drawing Sheets

Fig_5

CONVEYING DEVICE FOR ELECTRICAL COMPONENTS

BACKGROUND OF THE INVENTION

The invention relates to a conveying device.

There is known a conveying device (DE patent 1,231,624) which serves as a conveyor for plates or panes, in particular panes of glass, and wherein the means of conveyance is made of two chains which in each instance form a closed loop in two parallel and vertical planes at some distance apart and are driven around, as well as of striplike dogs or supports which in each instance are held by a chain at either end and extend perpendicular to the plane of the loops formed by the chains. Holders designed as suction cups, which are displaceable with respect to the means of conveyance and serve for receiving and holding the plates, are attached to the supports.

No special demands are made regarding the precision of movement of the holders in this known conveying device nor, indeed, could they be achieved because the chains forming the means of conveyance, owing to the articulated connection of a plurality of chain links in longitudinal direction or direction of conveyance, require considerable play and hence result in correspondingly great inaccuracy. The deviations occurring here are also dependent upon the position in which the respective holder actually finds itself, relative for example to a driven return wheel.

In addition, the production of a metal conveyor belt of stainless steel and the welding of the two ends, for the formation of an endless conveyor belt, is likewise known in principle (DE-OS 3,109,797).

SUMMARY OF THE INVENTION

The object of the invention is to indicate a conveying device which, despite a simple structural design, permits movement of the holding device along the conveying distance with great accuracy.

A conveying device corresponding to the present invention is designed to accomplish this object.

The use of a metal belt, preferably a steel belt, which is subject to no or to no appreciable elastic elongation, makes it possible, even with a relatively great length of the conveying distance, to obtain very exact positioning of the holders at, for example work stations set up along the conveyor, without separate indexing of the holders or supports being required at individual work areas or stations for exact positioning. The metal belt with the supports and the holders provided there can also be made especially simply. Owing to the fact that the supports are provided at the outside of the metal belt and the respective holding means with their convexly curved contact surface at the inside of the metal belt, the said metal belt is likewise capable of being carried over the return wheels without kinks appearing in the metal belt.

In a preferred embodiment, the holding elements, which for example are offsets and sleevelike or pinlike elements provided on them, at the same time form a "toothing" engaging in recesses in at least one return wheel, so that slip-free, very exact positioning for the holders themselves can be obtained by stepwise drive of this return wheel.

In one embodiment of the invention the conveying device is a component of a device for the processing or treatment of electrical components. In the sense of the invention, "processing or treatment" comprises a wide range of processing or treatment possibilities for components, in particular including separation or segregation of electrical components which are made on a so-called leadframe, reshaping of components with respect to length and/or shaping of their leads, testing and/or measurement and/or sorting or controlled feeding of these components at special feeding positions based on the values detected at at least one testing and measuring station, placement of components in hoppers or containers of a sorting station, in pockets of a belt, etc.

In the processing or treatment of electrical components, these are preferably supplied, in the form of a leadframe, for example of a multiple leadframe, to a feeding station in an axial direction perpendicular to the direction of conveyance of the conveyor belt there.

If the components are belted at a feeding position, i.e., at a belting station, the belt there is likewise carried in an axial direction perpendicular to the direction of conveyance. This results in an especially simple design of the feeding and/or belting station. To permit testing of the components as well as forming of the leads of these components, at least one turning station is advantageously provided, by which the components held on the holders of the conveyor belt are turned so that their leads lie in an axial direction perpendicular to the direction of conveyance. Before being belted components are then advantageously turned again by another turning station so that they are arranged with their leads in the direction of conveyance and hence, after insertion in the recesses of a belt, lie with the leads perpendicular to the longitudinal direction of the belt. The first turn permits particularly simple testing of the components and/or forming of the leads.

The components are preferably those having a body, advantageously approximately right parallelepiped-shaped, designed approximately flat on the upper and lower sides and advantageously with leads projecting on two opposing sides of this body.

BRIEF DESCRIPTION OF THE DRAWINGS

The invention is described in detail below by examples, with the aid of the figures, where.

DETAILED DESCRIPTION OF THE PREFERRED EMBODIMENT

Figure 1:
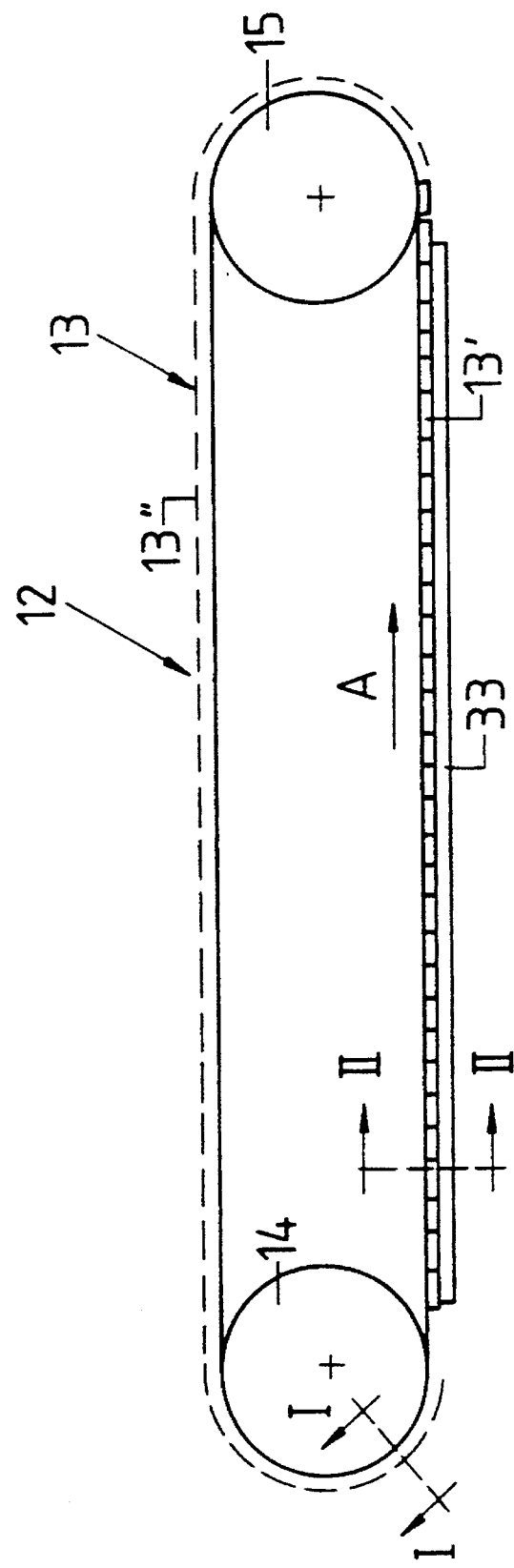
FIG. 1 shows, in greatly simplified representation and in top view, a conveyor for very small components according to the invention, specifically, in its use in a device for processing and/or treating electrical components.
Figure 2:
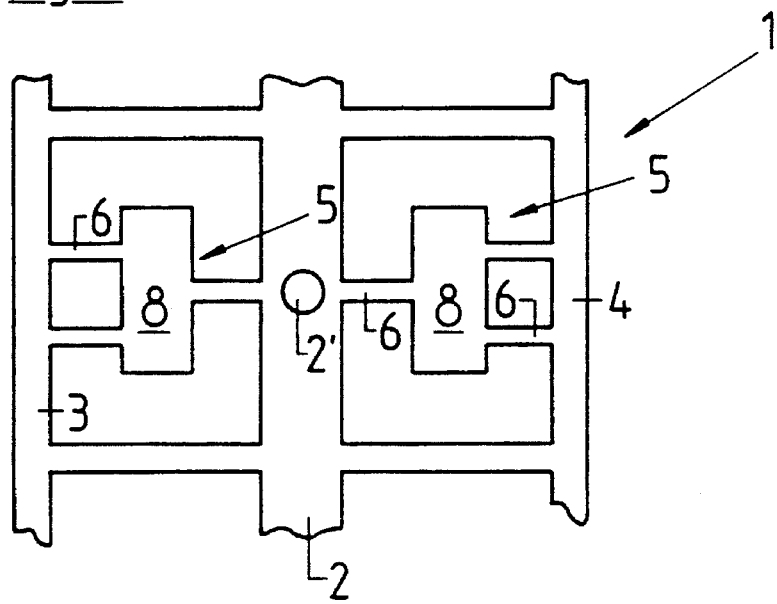
FIG. 2, in schematic representation and in top view, a length of a double leadframe having a plurality of electrical components.
Figure 3:
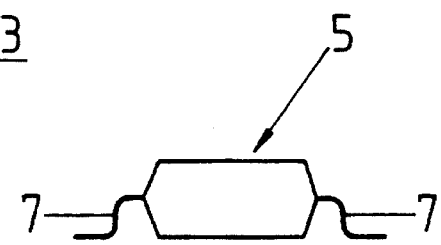
FIG. 3, in side view, a component, with bent-off leads, isolated from the leadframe by punching.
Figure 4:
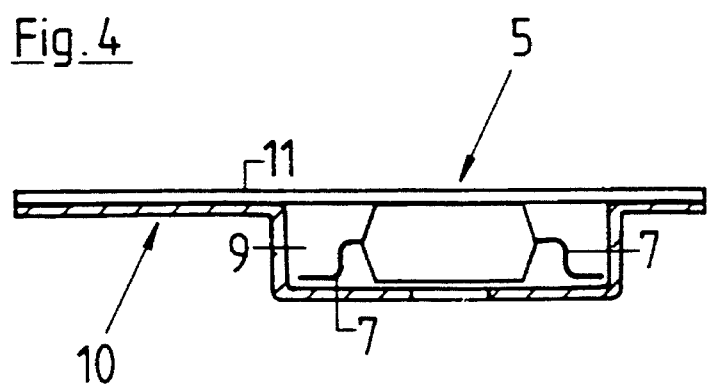
FIG. 4, in section, a length of a closed blister belt with a component arranged in a recess of this belt.

In the figures, 1 is a so-called double leadframe, which is made in known fashion as a punch strip of a metal or metal alloy suitable for connecting wires (leads) of electrical components 5, specifically, in such fashion that this leadframe, between a central strip-shaped section 2 and an outer strip shaped section 3 and 4 forming the two longitudinal sides in each instance, has the components 5 which, following one another at regular distances apart in the longitudinal direction of the leadframe 1 and by means of webs 6 of material that form the later leads 7 of the electrical components 5, are connected together with the sections 2 and 3 or 4 to make the leadframe. In the double leadframe the components 5 form two rows extending in longitudinal direction, specifically on either side of the central section 2, in which perforation holes 2' are punched at regular distances apart, that permit controlled stepwise exact advance of the leadframe 1 in processing.

The components 5 are punched out of the leadframe 1 by the device described in detail below. Then the webs 6 of material are bent S- or Z-shaped into leads 7 so that the ends of these leads lie at approximately the same level as the lower side of the body 8 of the respective component 5. Lastly, the components 5, which for example are transistors, tantalum capacitors or other components, are belted, i.e., each inserted into a depression 9 of a blister belt 10, whereupon this belt is then sealed on the open side of its depressions, i.e., closed off by a strip 11 of material. As an alternative to belting, the components 5 may be sorted at a sorting station into various receptacles or deposited in cartridges according to their electrical characteristics.

The procedure described above is performed at a plurality of work positions which are provided in the region of a conveyor 12, by which the components 5 are moved along to the individual work stations. As will be described in greater detail below, the conveyor consists essentially of a closed endless conveyor belt 13, driven cyclically, which forms a closed loop lying in the horizontal plane and for this is carried over two return wheels 14 and 15, of which the return wheel 15 is driven cyclically.

In the embodiment illustrated in FIGS. 1 to 11, the conveyor belt 13 forms a length 13', along which the various work stations are located and which may therefore be termed "work length," and a returning length 13".

Figure 5:
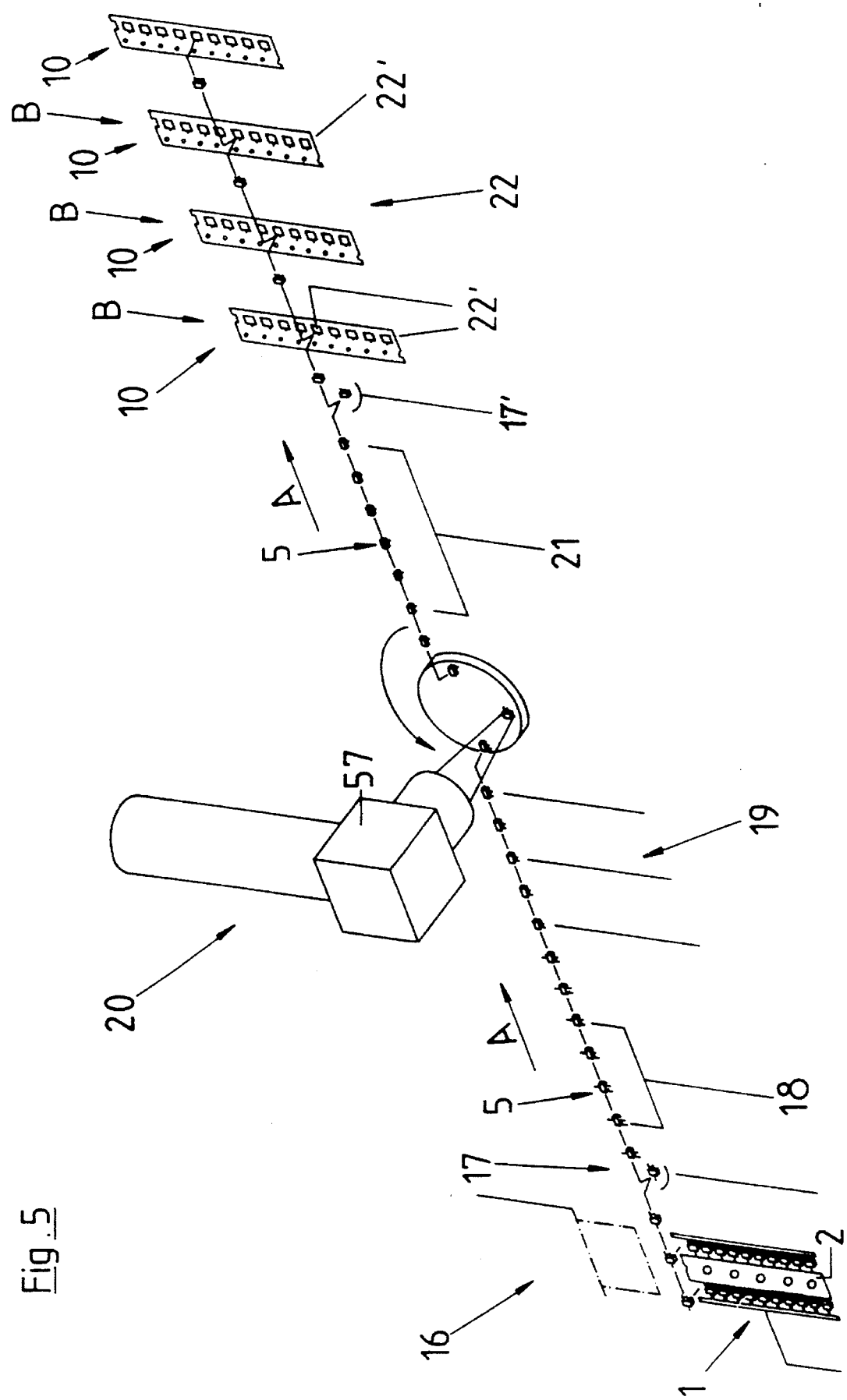
FIG. 5, in simplified representation, the individual process steps between punch-out of the components from the leadframe and placement of the components in the receiving container or in the recesses of the blister belt.

According to the schematic representation of FIG. 5, the following successive work stations are found on the work length 13' in the direction of travel or conveyance A of the conveyor belt 13:

feeding station 16
turning station 17
testing station 18
bending station 19
laser marking station 20
sorting station 21 and
belting station 22.

As already described above, the conveyor 12 consists essentially of the endless conveyor belt 13, which is carried over the two return wheels 14 and 15. There the return wheel 15 is driven cyclically via a special timing gear by the drive common to all the components of the machine.

Figure 6:
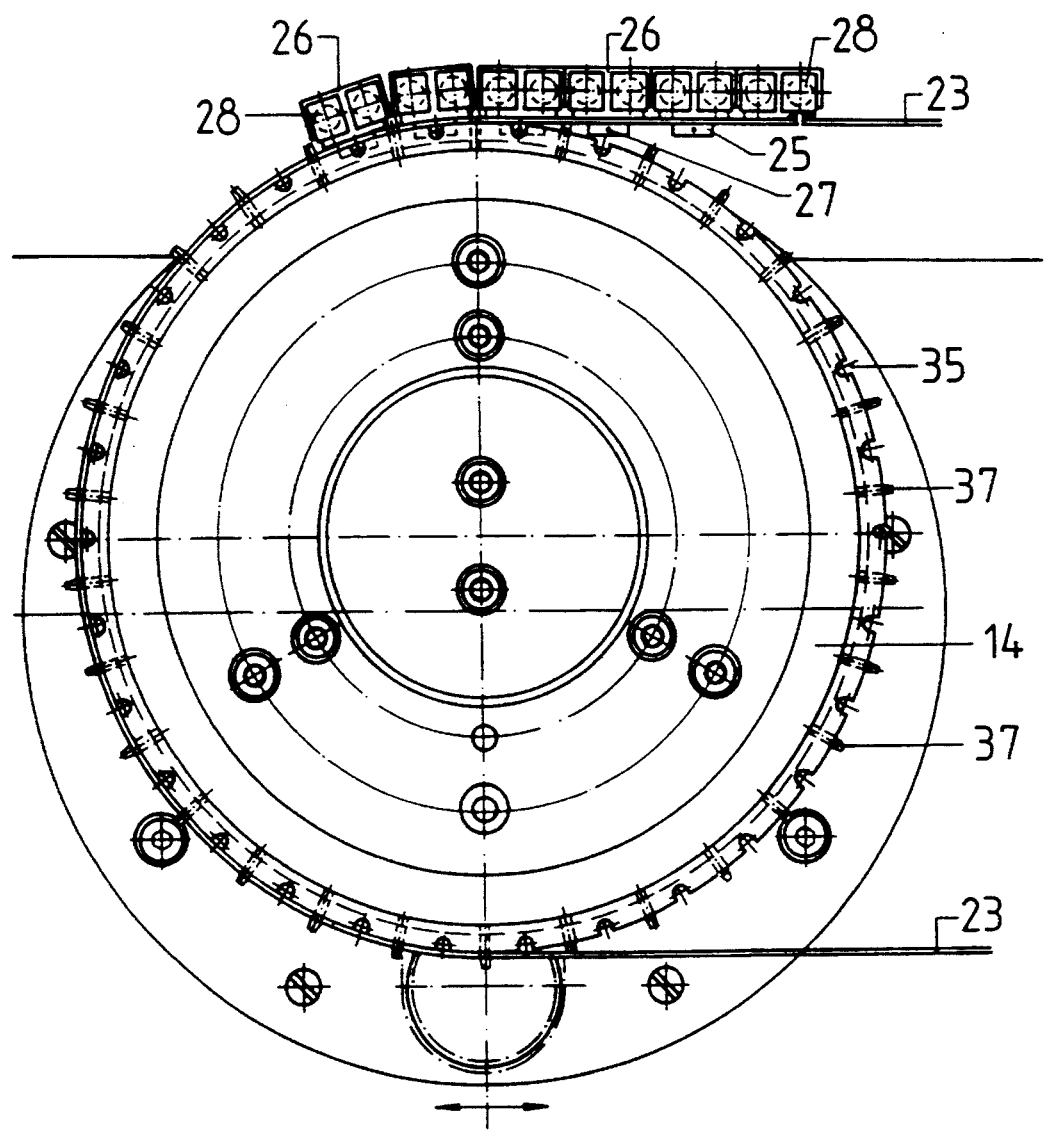
FIG. 6, in top view, a length of a conveyor belt of the conveyor.
Figure 7:
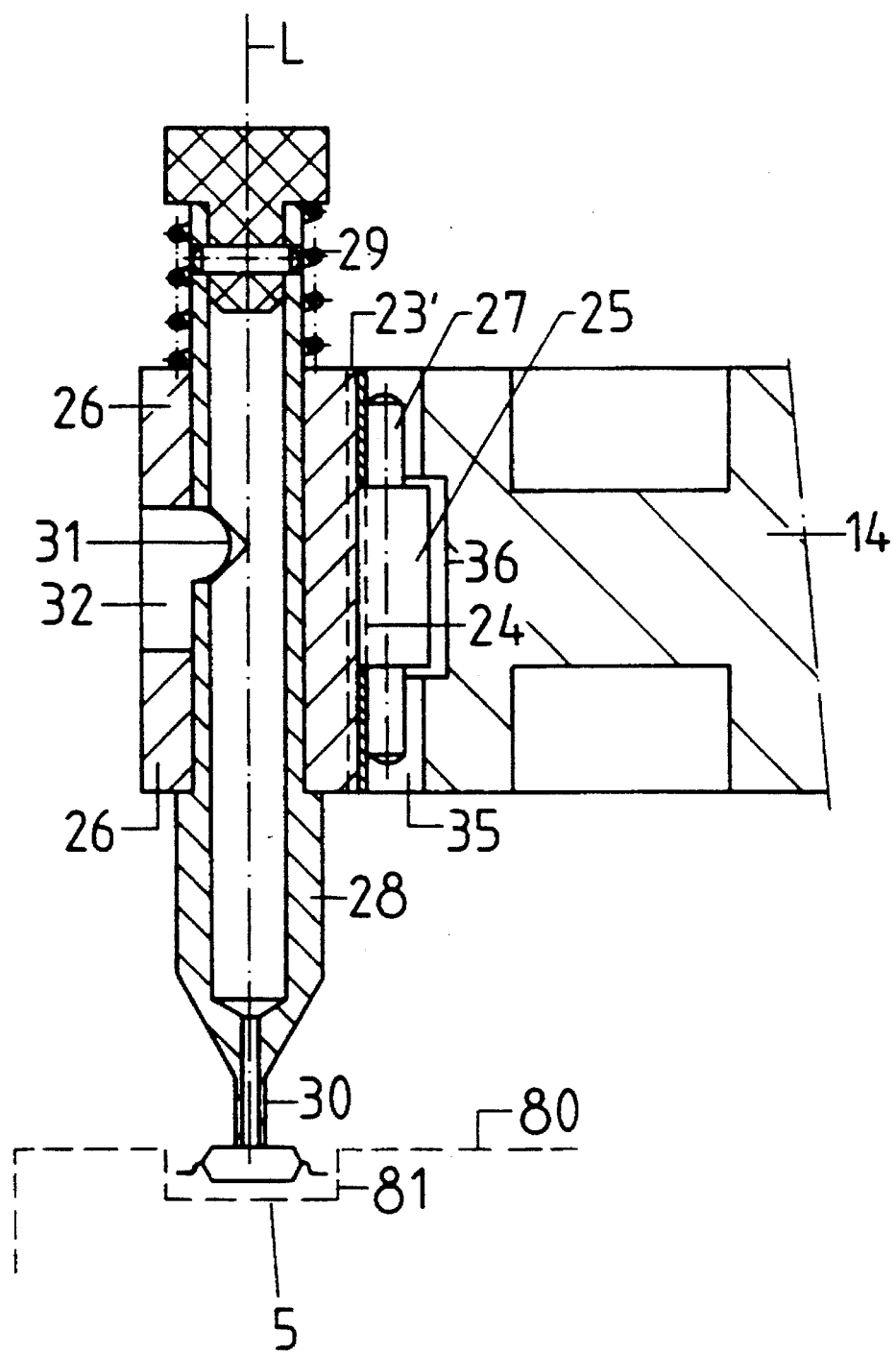
FIG. 7, a section through the conveyor belt in the region of a return wheel or according to the section I—I of FIG. 1.
Figure 8:
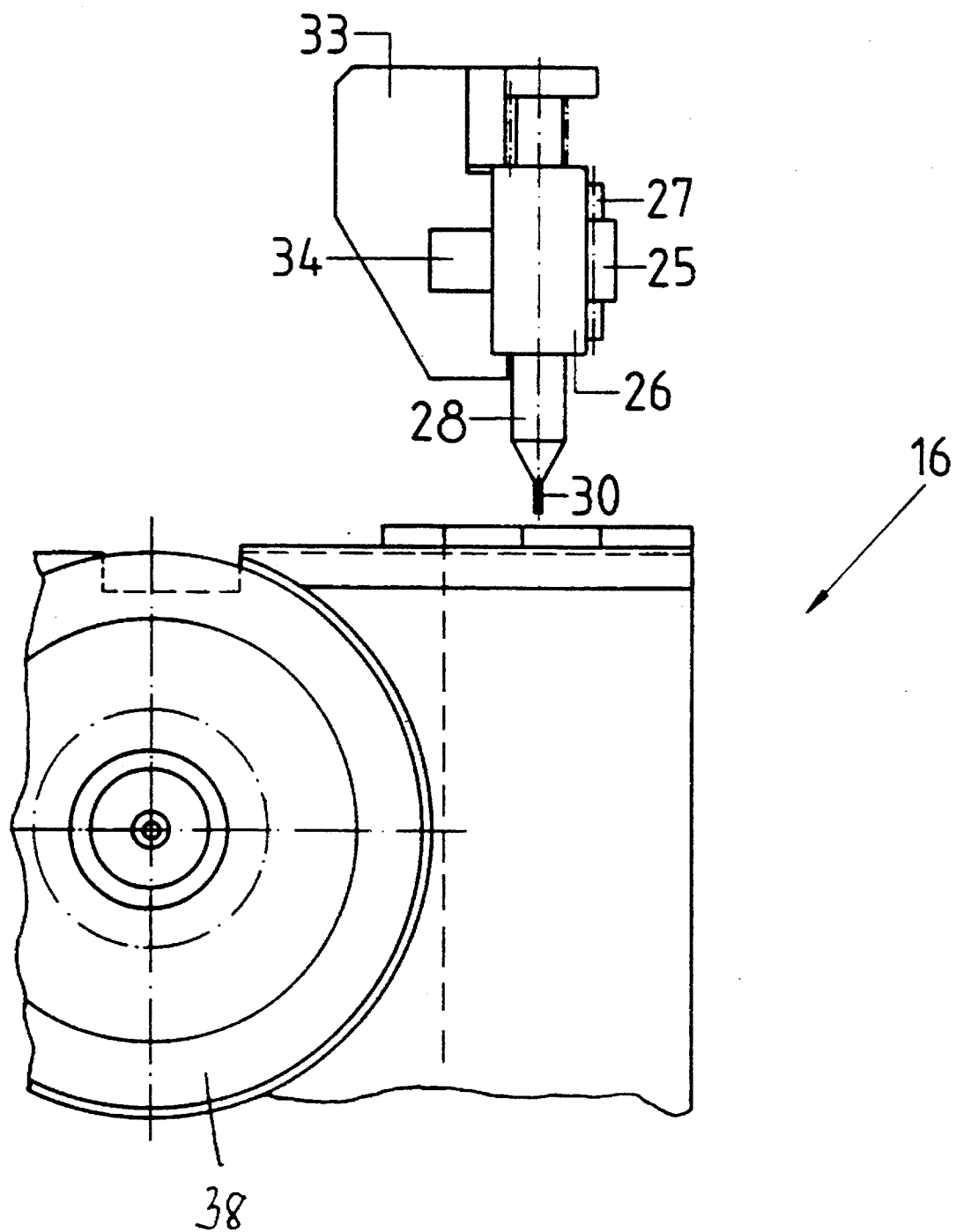
FIG. 8, in schematic representation and in side view, a section through the feeding and punching station.

As represented especially in FIGS. 6 and 7, the conveyor belt 13 consists of a steel belt 23, which is arranged on edge, i.e., with its larger surface sides in vertical planes, and with its two ends connected into a closed band. Fairly large openings 24 other than circular in shape, i.e., square in the embodiment represented, are in each instance provided at regular distances apart in the steel belt 23. An offset 25, adapted to the cross section of this opening, which is provided on the back of a support designed as a right parallelepiped-shaped block, passes through each opening. The supports 26 are provided, by means of their offsets 25, on the outer side of the loop formed by the steel belt 23, specifically, so that the faces of adjacent supports 26 running perpendicular to the direction of conveyance A lie close against each other in the rectilinear lengths 13' and 13". Each support 26 is secured by means of a splint or pin 27, which at the inner side of the loop formed by the steel belt 23 rests against the steel belt and is provided in the offset 25. Each pin 27 lies with its axis in vertical direction, i.e., parallel to the axis of rotation of the return wheels 14 and 15 and hence also perpendicular to the direction of conveyance A.

Following one another in the direction of conveyance A, two holders 28, designed as vacuum pipettes, are provided for the components 5 on each support 26. The holders 28 are each displaceable in an axial direction perpendicular to the direction of conveyance A and parallel to the axis of the return wheels 14 and 15, in the direction of their longitudinal axis L against the effect of a pressure spring 29, from a raised position into a lowered position. The holders 28, which are designed in the same way, consist essentially of a tubular piece, tightly closed at its upper end, which at its lower end is converted into a section 30, tapered suction nozzle-like or pipette-like in its outer and inner cross sections. Through openings 31 and 32 in the holder 28 or in the support 26, in the region of the work length 13', each holder 28 present there is in communication with a vacuum distribution chamber 34, which is formed on a guide rail 33 not moving along with the conveyor belt 13 and has a longitudinal slot, so that each holder 28, as long as it moves along the work length 13', is acted on by vacuum and at its section 30 or at the opening there can hold a component 5 by its body 8, as is indicated in FIG. 7.

The two return wheels 14 and 15 are provided at their periphery with a plurality of recesses 35 whose distribution spacing is equal to the distance apart of two pins 27 following one another in the direction of conveyance A and in which the upper and lower partial lengths of the pins 27 projecting over the offset 25 engage on the lengths of the conveyor belt carried about the return wheels 14 and 15. It is understood that the recesses 35 are in each instance provided pairwise on either side of a peripheral groove 36 of the return wheel 14 or 15, which (peripheral groove 36) serves for accommodation of the offsets 25. The pins 27 cooperating with the recesses 35 permit chainlike or toothed belt-like exact positioning of the conveyor belt 23 as a function of the respective angular position of the return wheels 14 and 15, so that in combination with the steel belt 23, even in a relatively great work area or on a relatively great work length 13', very exact positioning of the individual holders 28 at the respective work stations is obtainable with extremely small tolerances, in other words, despite the small dimensions of the components 5 or their bodies 8, which are in the order of magnitude of 1 to 2 mm, separate indexing of the supports 26 or the holders 28 at the work stations is not required.

In the special embodiment illustrated, in addition to the recesses 35 on the return wheels 14 and 15, pins 37, projecting radially, which engage in corresponding perforation holes of the conveyor belt 13 or steel belt 23, are additionally provided over the periphery of these wheels.

The two ends of the steel belt 23 are connected in that a support 26 is held at each end and these two supports are then connected together by way of a short length 23' of the steel belt 23 forming a connecting splicing plate. In this region the steel belt 23 and the connecting length 23' are then held at each offset 25, the connecting length 23' lying on the outside of the loop formed by the steel belt 23 and the two supports 26 provided at the connecting point, in an axial direction perpendicular to the surface sides of the steel belt 23, having a width reduced by the thickness of the steel belt 23 or of the length 23'. This results in the same conditions on the inside of the loop of the conveyor belt 13, including in the region of the connecting point, as in the remaining portion of the conveyor belt 13, so that even when the connecting point passes one of the return wheels 14 and 15, no variations adversely affecting the accuracy of position of the holders 28 occur in the conveyor belt 13.

The feeding station 16 is cyclically supplied by a supply coil 38 of the leadframe 1. There the components 5 are punched out of the leadframe 1 by means of a punch tool so that the metal webs 6 remain on the body of the component and form the leads 7.

Each component 5 is detected by a lowered holder 28 acted upon by the vacuum and then conveyed by the raised holder 28 (held by the vacuum) from the feeding station 16 through the various additional stations to finally either the sorting station 21 or to the belting station 22. At the sorting station 21 the components are sorted according to electrical test values and dropped into various pockets. At the belting station 22 the components 5 are inserted into the depressions 9 of the belts 10 ready and waiting there, specifically, a component 5 into a depression 9 in each instance. Insertion of a component 5 into a depression 9 is effected by vertical lowering of the holder 28. After insertion of a component 5 into a depression 9, the holder 28 is again raised. In doing so, the component 5 is retained in the depression by a bar or stripper.

At the turning station 17 the components 5 are turned so that the leads 7 have a predetermined orientation, for example, lie perpendicular to the direction of conveyance A. Testing of the components 5 takes place at the testing station 18. Bending of the leads 7 into the required shape is effected at the bending station 19. Marking or imprinting of the components 5 takes place at the laser marking station 20.

Figure 9:
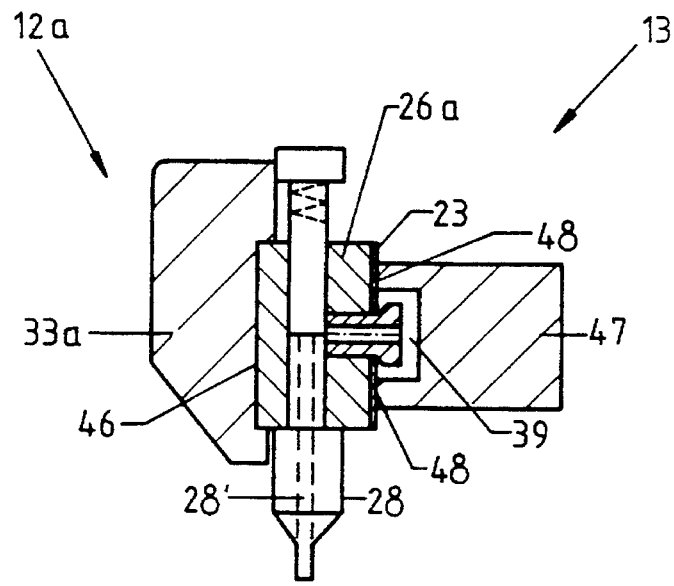
FIG. 9, in representation similar to that of FIG. 8, in vertical section, a support provided on the steel belt, together with the holder provided there, a guide rail and a vacuum supply rail in another embodiment of the invention.
Figure 11:
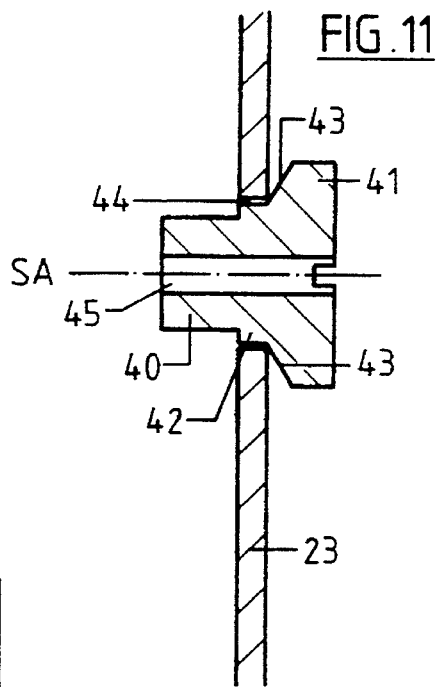
FIG. 11, in enlarged single representation, a screw forming a holding element for use in the conveyor of FIG. 9.
Figure 10:
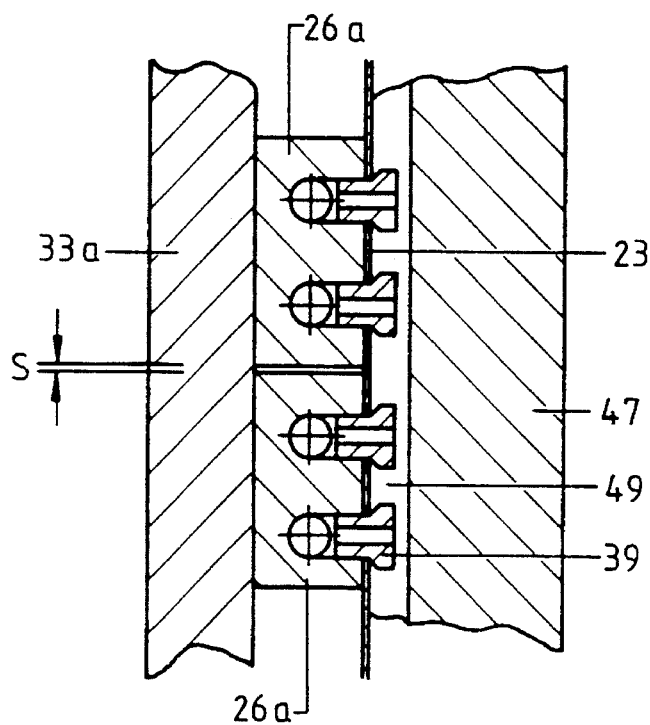
FIG. 10, a top view of a length of the conveying device of FIG. 9.

In FIGS. 9–11 there is represented as an additional embodiment a conveying device 12a, which differs from the device 12 essentially in the design of the supports 26a provided on the conveyor belt 13 or steel belt 23, as well as in the mounting of these supports on the steel belt 23. Otherwise the conveyor 12a corresponds to the conveyor 12 and the same reference numerals as in FIGS. 1–8 are again used for corresponding parts in FIGS. 9–11.

The supports 26a, which are provided closely following one another on the conveyor belt 13 or on the steel belt 23, are again designed right parallelepiped-shaped and are in each instance held on the steel belt 23 by means of two screws 39. Two pipette-like holders 28, specifically, in each instance displaceable in vertical direction and pretensioned in the raised position by the pressure spring 29, are provided on each support 26a.

The supports 26a are again found on the outside (relative to the loop formed by the steel belt 23) of this steel belt. The screws 39, as is represented particularly plainly in FIG. 11, have a shank or threaded section 40, a screwhead 41 and a collar 42, provided between the screwhead 41 and the threaded section 40, which forms a circular cylindrical surface surrounding the screw axis SA concentrically. On the side turned toward the threaded section 40 and the collar 42, the surface 43 of the screwhead 41 there is shaped convex, i.e., the surface 43 is a conical surface or a crowned convexly curved surface of a rotational solid having the axis SA.

Openings 44, whose cross section is slightly greater than the diameter of the screws 39 in the region of the collar 42, are provided in the steel belt 23. Two openings 44 form an opening pair and two screws 39 a screw pair for a support 26a. The distance apart of the openings 44 of each opening pair is selected so that each of the two screws 39, which are arranged staggered in the direction of conveyance A and are oriented with their screw axes SA perpendicular to the steel belt 23 standing on edge and to the direction of conveyance A, rests tightly against the edge of the associated opening 44 on the rectilinear lengths 13' and 13" of the conveyor belt 13 by the side of the collar 42 turned away from the other screw 39 in each instance, while on the side of the collar 42 turned toward the other screw 39 of a screw pair in each instance a slight distance exists between this collar and the edge of the opening 44. In this way, on the one hand, at any rate in the rectilinear sections 13' and 13" of the conveyor 12a, the supports 26a are exactly positioned with reference to the steel belt 23 and, in addition, return of the steel belt 23 at the return wheels 14 and 15 is possible.

The screws 39, the threaded section 40 of which in each instance engages in a thread of the support 26a concerned, are provided with an axial channel 45 open at either end. This channel 45 is in communication with the channel 28' formed in the respective holder 28.

FIGS. 9 and 10 show a guide rail 33a, corresponding to the guide rail 33, which forms a guide groove 46 in which the support 26a is guided by its side turned away from the steel belt 23 and which also partially guides the support 26a at its upper and lower sides. A guide rail 47, which extends parallel to the guide rail 33a in the direction of conveyance A and against which the inner side of the steel belt 23 turned away from the supports 26a rests and forms a guide surface 48 for this side of the steel belt 23, is provided facing the guide rail 33a. In the region of the guide surface 48 there is formed a groove-like vacuum distribution channel 49, whose open side turned toward the guide rail 33a is completely covered by the steel belt 23 and into which the screwhead 41 of the screws 39 extends so that the associated holders 28 are acted upon by vacuum by way of this vacuum distribution channel 49 and the screws 39 with their screwhead 41 found in this channel. Owing to the fact that the channel 49 is covered by the steel belt 23, vacuum losses are largely avoided. Sealing elements, for example disklike sealing elements, acting for example like locks, are provided at either end of the channel 49.

Owing to the convex design of the surfaces 43 by which the screws 39 rest against the inner side of the steel belt 23, it is again ensured in this embodiment as well that the steel belt 23 can be carried over the return wheels 14 and 15 without kinks occurring in the steel belt. The screwheads 41 again serve as toothing engaging in at least one return wheel 14 and 15.

The invention has been described above by way of examples. It is understood that variations and modifications are possible.

| List of Reference Numerals | |
|---|---|
| 1 | Leadframe |
| 2, 3, 4 | Section |
| 2' | Perforation opening |
| 5 | Component |
| 6 | Web of material |
| 7 | Lead |
| 8 | Body |
| 9 | Depression |
| 10 | Belt |
| 11 | Strip of material |
| 12, 12a | Conveyor |
| 13 | Conveyor belt |
| 13', 13" | Lengths |
| 14, 15 | Return wheel |
| 16 | Feeding station |
| 17, 17' | Turning station |
| 18 | Testing station |
| 19 | Bending station |
| 20 | Laser marking station |
| 21 | Sorting station |
| 22 | Belting station |
| 23 | Steel belt |
| 23' | Length |
| 24 | Opening |
| 25 | Offset |
| 26, 26a | Support |
| 27 | Pin |
| 28 | Holder |
| 29 | Spring |
| 30 | Section |
| 31, 32 | Opening |
| 33, 33a | Guide rail |
| 34 | Vacuum channel |
| 35 | Recess |
| 36 | Peripheral groove |
| 37 | Pin |
| 38 | Supply coil |
| 39 | Screw |
| 40 | Threaded section |
| 41 | Screwhead |
| 42 | Collar |
| 43 | Surface |
| 44 | Opening |
| 45 | Channel |
| 46 | Guide groove |
| 47 | Guide rail |
| 48 | Guide surface |
| 49 | Vacuum distribution channel |

I claim:

1. Conveying device for the conveyance of electrical components (5), which conveying device has a means of conveyance, which has a direction of conveyance, forming a closed loop and carried over at least two return wheels (14, 15) as well as holders (28) positioned on the means of conveyance for receiving the components (5), wherein the means of conveyance is a metal belt having supports (26, 26a) which carry the holders (28), characterized in that the supports (26, 26a) are positioned on the outer side of the metal belt (23), relative to the loop, and held from inside by at least one holding element (27, 39) in each instance which rests, by a region which is shaped convex about an axis which is perpendicular to the direction of conveyance (A) and parallel to the surface of the belt, against the inner surface of the metal belt (23).

2. Conveying device according to claim 1, characterized by guides on the supports (26, 26a) by which the guide holders (28) are displaceable in a direction perpendicular to the direction of conveyance.

3. Conveying device according to claim 1, characterized in that the metal belt (23) is a steel belt.

4. Conveying device according of claim 1, characterized in that there provided at least one guide rail (33, 47) for the supports (26, 26a), not moving along with the metal belt (23), as well as a vacuum distribution channel (34, 49) formed in the latter for the holder which functions as a vacuum holder (28).

5. Conveying device according of claim 1 characterized in that the holders (26, 26a) rest against one another in planes running perpendicular to the direction of conveyance (A), at least during a rectilinear movement.

6. Conveying device according to claim 1, characterized in that said at least one holding element (27, 39) is curved convex.

7. Conveying device according to claim 1, characterized in that the convex shaped region of said at least one holding element resting against the inner surface of the metal belt (23) is made of a pinlike element (27) held in an offset (25) of the support (26).

8. Conveying device according to claim 1, characterized in that said at least one holding element consists of a shaft with a head (41), which is designed convex at an inner surface (43) and rests against the inner surface of the metal belt (23).

9. Conveying device according to claim 1, characterized in that the metal belt (23), for making the loop, is provided at either end with one of said supports (26, 26a), and in that the supports (26, 26a) at these ends are connected together by a splicing length (23') of a metal belt (23).

10. Conveying device according to claim 1, characterized in that the said at least one holding element for the supports (26, 26a) engage in recesses (35) of at least one of said return wheels (14, 15).

11. Conveying device according to claim 1, characterized in that index pins (37), which engage in perforation openings of the metal belt (23), are provided with at least one of said return wheels (14, 15) and radially project from said return wheel.

12. Conveying device according to claim 1 characterized in that a plurality of, holders (28) are provided at each support (26a).

13. Conveying device according to claim 1, characterized in that the conveying device is a component of a device for the processing and treatment of electrical components (5), which has at least one feeding station (16), at which the components (5) are in each instance successively delivered to the holder (28) moving cyclically past said at least one feeding station, as well as at least one discharge or removal station (21, 22) for the components.

14. Conveying device according to claim 4, characterized in that said guide rail (47) having said vacuum distribution channel (48) is provided at the inner side of the metal belt (23) turned away from the supports (26a) and forms a guide surface (48) for this inner side of the metal belt (23), in that the vacuum distribution channel (49) has a side open toward the metal belt (23) which is covered by the metal belt (23), and in that the vacuum distribution channel (49) is in communication, by at least one opening or channel (45) in the metal belt (23) and in the said at least one holding element (39), with a channel (28') formed in the vacuum holder (28).

15. Conveying device according to claim 1, characterized in that the convex shaped region of said at least one holding element resting against the inner surface of the metal belt (23) is made of a sleevelike element held in an offset (25) of the support (26).

16. Conveying device according to claim 4, characterized in that said guide rail (47) having said vacuum distribution channel (48) is provided at the inner side of the metal belt (23) turned away from the supports (26a) and forms a guide surface (48) for this inner side of the metal belt (23), in that the vacuum distribution channel (49) has a side open toward the metal belt (23) which is covered by the metal belt (23), and in that the vacuum distribution channel (49) is in communication, by at least one opening or channel (45) in the metal belt (23) with a channel (28') formed in the vacuum holder (28).

17. Conveying device according to claim 4, characterized in that said guide rail (47) having said vacuum distribution channel (48) is provided at the inner side of the metal belt (23) turned away from the supports (26*a*) and forms a guide surface (48) for this inner side of the metal belt (23), in that the vacuum distribution channel (49) has a side open toward the metal belt (23) which is covered by the metal belt (23), and in that the vacuum distribution channel (49) is in communication, by at least one opening or channel (45) in the metal belt (23) and in the said at least one holding element (39), with a channel (28') formed in the vacuum holder (28).

\* \* \* \* \*

UNITED STATES PATENT AND TRADEMARK OFFICE
CERTIFICATE OF CORRECTION

PATENT NO. : 5,494,149
DATED : February 27, 1996
INVENTOR(S) : Georg Sillner

It is certified that error appears in the above-indentified patent and that said Letters Patent is hereby corrected as shown below:

Column 7, line 49 (claim 1), after "15)", insert --,--.

Column 7, line 60 (claim 2), delete "guide".

Column 7, line 66 (claim 4), after "there" insert --is--.

Column 8, line 5 (claim 5), change "holders" to --supports--.

Column 8, line 36 (claim 12), delete ",".

Column 10, lines 5-6 (claim 17), delete "in the metal belt (23) and".

Signed and Sealed this

Seventeenth Day of September, 1996

Attest:

BRUCE LEHMAN

Attesting Officer    Commissioner of Patents and Trademarks